United States Patent [19]

Zust

[11] Patent Number: 5,047,896
[45] Date of Patent: Sep. 10, 1991

[54] ASSEMBLY OF MULTI-LAYER CIRCUIT BOARDS SECURED BY PLASTIC RIVETS

[75] Inventor: Harry Zust, Erlenbach, Switzerland

[73] Assignee: Fela Planungs Ag, Baden-Dattwil, Switzerland

[21] Appl. No.: 433,575

[22] Filed: Nov. 8, 1989

[30] Foreign Application Priority Data

Nov. 11, 1988 [CH] Switzerland ............... 04190/88

[51] Int. Cl.⁵ .................................. H05K 1/00
[52] U.S. Cl. ........................ 361/412; 29/830; 403/408.1
[58] Field of Search .............. 411/504, 506; 403/408.1; 29/432.1, 507, 509, 512, 522.1, 524.1, 830; 361/412, 396

[56] References Cited

U.S. PATENT DOCUMENTS

| | | | |
|---|---|---|---|
| 3,099,057 | 7/1963 | Cook | 411/501 |
| 3,445,929 | 5/1969 | Wolf | 411/501 |
| 3,499,808 | 3/1970 | Obeda | 411/504 |
| 3,650,647 | 3/1972 | Jacobs et al. | 264/249 |
| 3,754,310 | 8/1973 | Shea | 29/25.42 |
| 3,880,486 | 4/1975 | Avakian | 361/412 |
| 3,904,934 | 9/1975 | Martin | 361/412 |
| 3,917,983 | 11/1975 | Kuronen | 428/582 |
| 4,253,226 | 3/1981 | Takeda | 264/249 |
| 4,478,544 | 10/1984 | Strand | 411/908 |
| 4,598,453 | 7/1986 | Wills | 29/271 |
| 4,687,395 | 8/1987 | Berecz et al. | 411/501 |
| 4,817,264 | 4/1989 | Worthing | 411/501 |

FOREIGN PATENT DOCUMENTS

| | | | |
|---|---|---|---|
| 0167867 | 1/1986 | European Pat. Off. | |
| 2252163 | 5/1973 | Fed. Rep. of Germany | |
| 1143895 | 3/1985 | U.S.S.R. | 403/408.1 |
| 555151 | 2/1943 | United Kingdom | |

Primary Examiner—Willard E. Hoag
Attorney, Agent, or Firm—Schweitzer, Cornman & Gross

[57] ABSTRACT

An assembly of aligned, stacked, circuit boards for hot-pressing in an evacuated bag utilizes a sliding body formed of a thermoplastic material which is inserted into elongated peripheral board holes. The sliding body is dimensioned to allow the boards to be slideable in a longitudinal direction at the direction of the sliding body to allow thermal expansion to be compensated for. Disclosed is a tool for reforming the sliding body after insertion into the board holes has a cylindrical heating element with a central bore in which a centering pin is located. The heating element is surrounded by a tubular device which is biased in a sleeve by a compression spring. Application of the tool against the inserted sliding body causes heat forming of a portion of the sliding body to maintain the circuit boards in registry during the hot-pressing period.

3 Claims, 2 Drawing Sheets

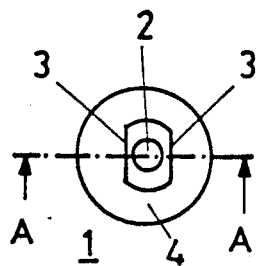
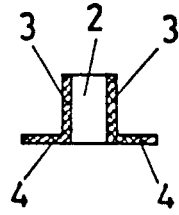
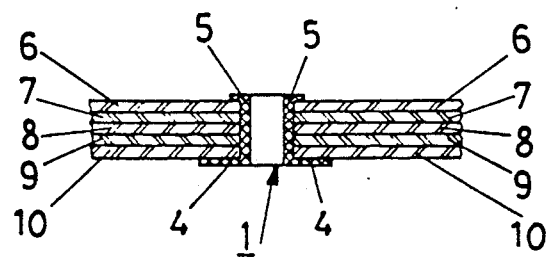
Fig.1a   Fig.1b   Fig.1c
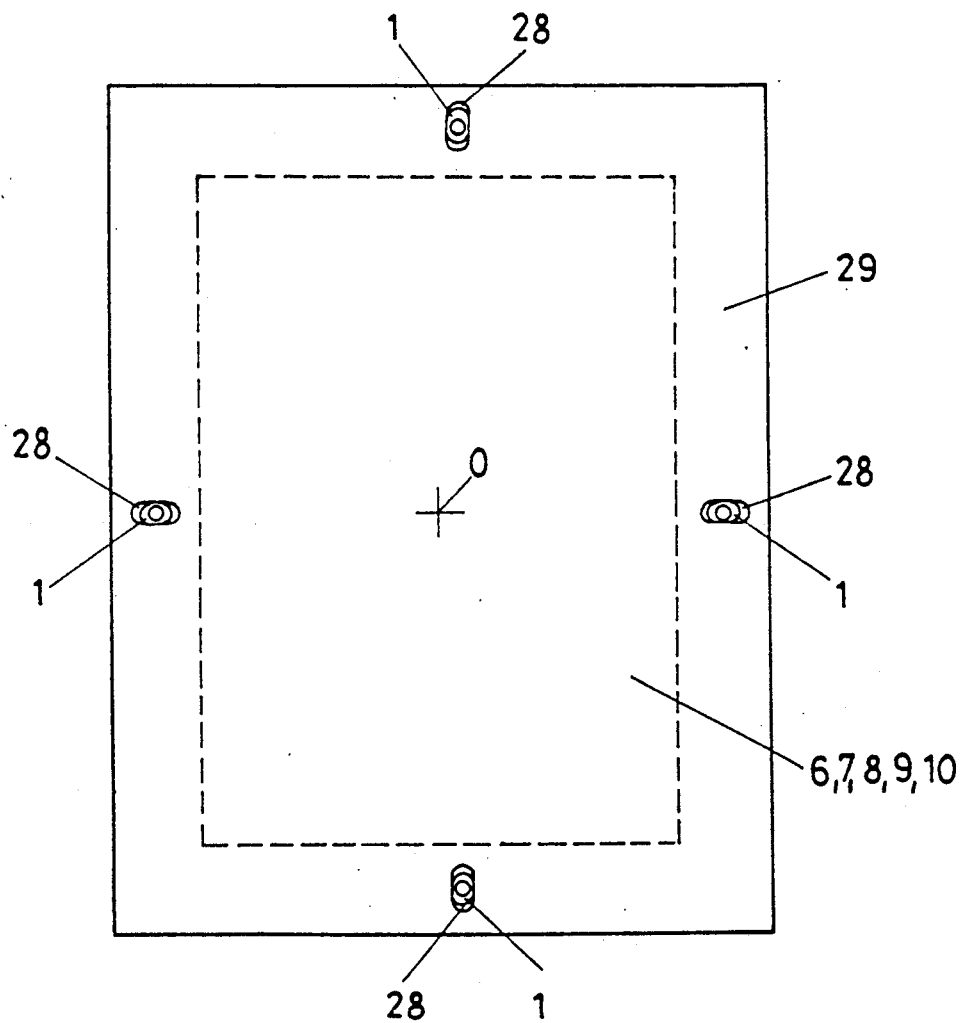
Fig.2

ASSEMBLY OF MULTI-LAYER CIRCUIT BOARDS SECURED BY PLASTIC RIVETS

BACKGROUND OF THE INVENTION

The present invention relates to a method for positioning and fixing electronic circuits disposed in layers upon a plurality of insulating circuit boards in a hot-pressing process, whereby several circuit boards are stacked so as to be congruent in their circuit layout and wherein elongated holes are provided in the area at the edge of the boards. The present invention also relates to a means for carrying out the method and to a device employing the means.

Multiple layer circuit boards are typically formed by pressing a plurality of circuit layers and bonding sheets held together by bolts in a vacuum whereby the boards are bonded together into so-called "multi-layers". The firm Fela Planungs AG offers a device for sale under the trademark "Multiklav" in which a plurality of assemblies of circuit layers are subjected to pressure and heat by a hydraulic fluid while in an evacuated bag made of a suitable elastomer, as disclosed in EP-A1-0 297 027. The individual circuit layers are stacked together with bonding sheets (prepregs) which are held in position temporarily during the press cycle by bolts extending through the elongated holes.

In practice, it has been shown that the elastomeric bags used in the "Multiklav" unit are exposed to extensive mechanical loads at the points in the stack where the circuit boards are held together by the bolts and for this reason wear out prematurely. If failure occurs during the pressing process, the enclosed boards are contaminated by the hydraulic oil.

Accordingly, an object of the invention is to provide a method and a means of carrying out the method so as to considerably lengthen the life of the bag and to exclude the danger of soiled boards due to hydraulic oil contamination.

BRIEF DESCRIPTION OF THE INVENTION

In accordance with the present invention, the method is characterized in that a "sliding body" formed of a thermoplastic material and having a flange at one end is inserted into the aligned, elongated holes of the stacked boards so as to be tightly fitting across the width of the slots. A portion of the sliding body which protrudes out of the stacked boards is formed and reshaped in such a way that the circuit boards are retained by the sliding body, but are slidable in a longitudinal direction over the sliding body to balance out and/or compensate for thermal expansion. The stacked circuit boards are thus also allowed to expand at high temperatures without mutual distortion and/or displacement.

Due to the use of a thermoplastic material the sliding body may be secured mechanically by thermal flanging to the stack of boards in an efficient and economical manner, and which in addition insures that the boards are able to slide in the longitudinal direction.

A preferable embodiment of the sliding body has a central bore and two parallel sliding surfaces. In general, any thermoplastic synthetic material may be used for the sliding body. The high temperatures and pressures employed, however, necessitate dimensional stability through at least 170 degrees C., measured according to Vicat. Synthetic materials such as polyamides, polyimides and polysulphones have proved suitable.

The sliding bodies may be flanged with a device having an integral heating element associated with a spring-loaded mandrel or sleeve, slideable in the longitudinal direction. A centering pin made of graphite allows clean and mechanically faultless flanging, and results in flanging which does not burden the elastomeric bag mechanically.

BRIEF DESCRIPTION OF THE DRAWINGS

A preferred, but nonetheless illustrative embodiment of the invention is described in the following detailed description in association with the annexed drawings, wherein:

FIG. 1a is a top plan view of the sliding body of the invention;

FIG. 1b is a sectional elevational representation of the sliding body taken along the line A—A of FIG. 1a;

FIG. 1c is a sectional view of the sliding body installed and flanged upon a stack of circuit boards;

FIG. 2 is a top plan view of a circuit board stack held together with sliding bodies.

DETAILED DESCRIPTION OF A PREFERRED EMBODIMENT

Figure 3:
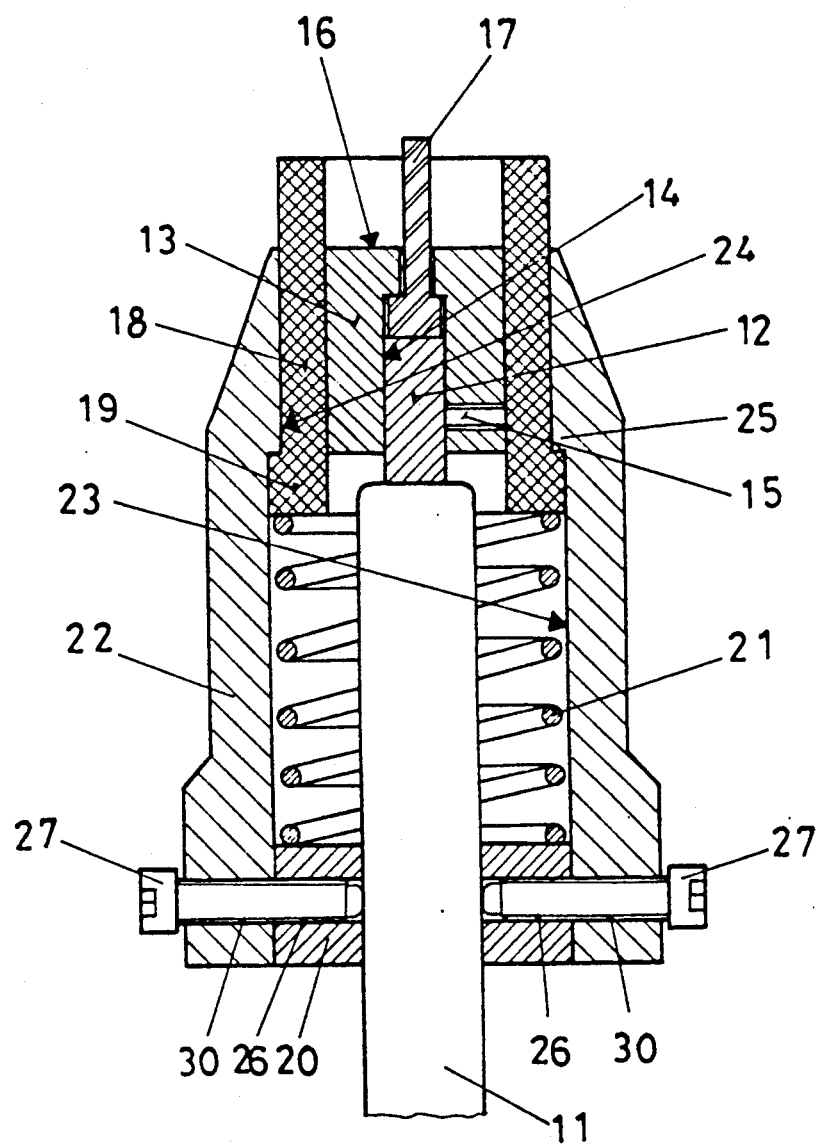
FIG. 3 is a cross-sectional, elevational representation of a tool used for installing a sliding body.

As seen in FIGS. 1a and 1b, sliding body 1 is generally cylindrical in length and is provided with a continuous central bore 2 in its center. The cylindrical body has two parallel, opposed flattened sliding surfaces 3. At the lower end of the cylindrical central portion of the sliding body is a thin, circular flange 4. As seen in FIG. 1c, several circuit boards 6 to 10 may be secured together by the sliding body 1 being inserted through aligned bores in the boards, the upper edge of the cylindrical portion being formed into a collar 5 to retain the boards.

In FIG. 3, a tool is shown which may be used to form the sliding body 1 in an especially effective and simple manner. A copper insert 12 is provided at one end of a commercially available heating cartridge 11. The heating capacity of the heating cartridge 11 is preferably about 50 watts, and may be adjustable as known in the art. Slid over the copper insert 12 is a cylindrical heating element 13 made of a vanadium steel alloy such as V2A or V4A and having a stepped bore 14 at its center. The heating element 13 is securely screwed to the copper insert 12 by a hexagonal socket-head bolt 15 threaded into the heating element 13, the bolt 15 being recessed so as to not project beyond the outer surface of the heating element.

The upper end of the heating element 13 forms a ring-shaped heating surface 16. A headed centering pin 17 projects upwardly from the heating surface 16 and is dimensioned to fit within and be retained by stepped bore 14. The centering pin 17, which is dimensioned to be insertable within the bore 2 of sliding body 1, consists of a material of lesser heat conductivity than the heating surface 16 and may preferably be of graphite. An insulator, such as aluminum oxide, may also be used.

Slid over the heating element 13 is a tubular device 18 which has a flange 19 at its lower end. The tubular device 18 is preferably made of polytetrafluorethylene (PTFE) reinforced with carbon, heat-resistant to temperatures above 300 degrees C. Mounted lower down on the heating cartridge 11 is cylindrical ring-piece 20, which acts as a support for a compression spring 21, which is biased to push the tubular device 18 upwards by contacting its lower surface. Ring-piece 20 may be formed of an aluminum-magnesium-alloy ("Anticorodal").

Slid over the tubular device 18 and the ring-piece 20 is brass sleeve 22, having a first inner bore 23 joined to a second, smaller inner bore 24 to create an inner peripheral stop or shoulder 25. The first inner bore 23 corresponds to the diameter of the ring-piece 20 and the flange portion 19 of tubular device 18. The second inner bore 24 corresponds to the diameter of the upper, narrower part of the tubular device 18. Provided in the ring-piece 20 are two opposed threaded bores 26, which are aligned with two threaded bores 30 in the sleeve 22. Alternatively, the bores 30 may be unthreaded. The sleeve 22 and the ring-piece 20 are fastened to the heating cartridge 11 by means of two hexagonal socket-head bolts 27 which are screwed into the boreholes 30 and 26, and which contact the sides of the cartridge. As may be appreciated, the distance between the upper edge of the tubular device 18 and the heating surface 16 may be adjusted by shifting the ring-piece 20 and sleeve 22 vertically on the heating cartridge 11.

FIG. 2 shows several boards 6 to 10 each which may comprise a substrate upon which film circuit elements are deposited on the boards as known in the art. The circuit layers are stacked with the intermediate bonding sheets, and form a multi-layer, held together by sliding bodies 1. The sliding bodies 1 are each inserted within the elongated holes 28 which are in the peripheral area 29 at the edge of the circuit boards, the parallel surfaces 3 of the bodies being aligned with the elongated parallel sides of the holes. Each of the sliding bodies 1 is formed of a thermoplastic material which has a melting point-like fluid region of up to at least 180 degrees C. and dimensional stability through at least 170 degrees C., according to Vicat. Polyamides, polyimides, and polysulphones are especially suitable. The sliding body is then formed using the tool of FIG. 3.

The tubular device 18 is positioned over a sliding body 1 with centering pin 17 aligned with the central bore 2. The tool is then pressed into engagement with the board through which the sliding body projects, spring 21 compressing as tubular device 18 retracts into sleeve 22 until top surface 16 of heating element 13 engages and shapes the upper edge of the sliding body 1 into the flattened and widened collar 5, as seen in FIG. 1c. The tool is then withdrawn slightly so that the surface 16 is no longer in contact with the sliding body while tubular device 18 remains in contact with the topmost circuit layer, maintaining the stack of boards together. The sliding body 1 is thus allowed to cool and harden to retain the boards together.

Since the sliding bodies 1 have a high body stability during a hot-pressing process, and particularly in an isostatic pressing process in an autoclave wherein the circuit boards 6 to 10 are held together and put into a continuously evacuated bag, the epoxy resin from the circuit boards 6 to 10 flows around the sliding bodies 1 without being bonded to the latter, which is often the case when metal bolts are used. Since each of the elongated holes 28 is situated along a line defining the midpoint 0 of the boards, thermal expansion is balanced out and/or compensated for. Thus, displacement of the circuit layouts relative to each other may be prevented. This is very important because the circuit layers 6 to 10 are almost always slightly undulated, which normally leads to such displacement and distortion.

After the hot-press cycle whereby the circuit layers 6 to 10 are permanently bonded, the sliding bodies 1 are removed from the elongated holes 28 with a punch the shape of which duplicates the shape of the sliding body. The elongated bores can then be utilized as part of a reference system for hole drilling and for etching the outside conductor patterns of the multi-layer circuit which has been produced.

It is of course recognized that other adhesives, which are specifically adapted for circuit boards or similar components, may be used instead of the currently used epoxy-composite films and the teaching of the invention may be applied thereto.

In addition, the device presented herein in the form of a hand tool may be similarly employed as part of a mechanized system, for example, in combination with positioning and punching means. It is preferred to use brass instead of graphite for the centering pin, since brass is easier to machine and mechanically more stable.

What is claimed is:

1. A multi-layer assembly comprising a plurality of planar circuit layer stacked in registry and defining a series of elongated, aligned holes having parallel sides about the periphery thereof, and a plurality of sliding bodies each formed of a thermoplastic material and having a flange at one end and a second end, each of said bodies further having a central bore therethrough having its axis extending between said ends and two opposed planar sliding surfaces parallel to said axis and parallel to each other, each of said sliding bodies being inserted into one of said elongated each sliding body being dimensioned to be tightly fitting within said elongated hole with said sliding surfaces being aligned parallel to the parallel sides of said elongated hole, the second end of the sliding body projecting beyond said stacked elements, said second end being expandable into a collar whereby the stacked planar elements are retained together and are slidable in a longitudinal direction about the sliding body.

2. The multi-layer assembly of claim 1, wherein said thermoplastic synthetic material forming said sliding bodies has a melting point-like fluid region extending through at least 180 degrees C. and dimensional stability through at least 170 degrees C.

3. The multi-layer assembly of claim 2, wherein said thermoplastic synthetic material is chosen from the group consisting of polyamides, polyimides and polysulphones.

* * * * *